(12) United States Patent
Kiryu et al.

(10) Patent No.: US 7,080,298 B2
(45) Date of Patent: Jul. 18, 2006

(54) CIRCUIT APPARATUS AND METHOD FOR TESTING INTEGRATED CIRCUITS USING WEIGHTED PSEUDO-RANDOM TEST PATTERNS

(75) Inventors: Naoki Kiryu, Austin, TX (US); Louis B Bushard, Rochester, MN (US)

(73) Assignees: Toshiba America Electronic Components, Irvine, CA (US); International Business Machines Corporaton, Armonk, NY (US)

( * ) Notice: Subject to any disclaimer, the term of this patent is extended or adjusted under 35 U.S.C. 154(b) by 286 days.

(21) Appl. No.: 10/358,461

(22) Filed: Feb. 4, 2003

(65) Prior Publication Data

US 2004/0153916 A1 Aug. 5, 2004

(51) Int. Cl.
*G01R 31/28* (2006.01)
(52) U.S. Cl. ........................ 714/724; 714/739
(58) Field of Classification Search ............... 714/739, 714/738, 741, 728, 726, 727, 729, 734, 724, 714/30; 377/73, 54
See application file for complete search history.

(56) References Cited

U.S. PATENT DOCUMENTS

| | | | |
|---|---|---|---|
| 5,043,988 A * | 8/1991 | Brglez et al. | 714/739 |
| 5,181,191 A | 1/1993 | Farwell | |
| 5,612,963 A * | 3/1997 | Koenemann et al. | 714/739 |
| 5,805,608 A | 9/1998 | Baeg et al. | |
| 5,983,380 A | 11/1999 | Motika et al. | |
| 6,327,684 B1 | 12/2001 | Nadeau-Dosti et al. | |
| 6,671,838 B1 * | 12/2003 | Koprowski et al. | 714/726 |

OTHER PUBLICATIONS

M. Morris Mano, "Computer System Architecture", 2$^{nd}$ edition, Prentice-Hall, Inc., NJ, 1982, pp. 53-54.*

* cited by examiner

*Primary Examiner*—Christine T. Tu
(74) *Attorney, Agent, or Firm*—Hogan & Hartson LLP

(57) ABSTRACT

A method for testing an electronic circuit includes selecting an input signal using a first multiplexer, selecting a signal to be input to the first multiplexer using at least one other multiplexer, and controlling the at least one other multiplexer using a selection signal output from a control circuit.

11 Claims, 4 Drawing Sheets

CIRCUIT APPARATUS AND METHOD FOR TESTING INTEGRATED CIRCUITS USING WEIGHTED PSEUDO-RANDOM TEST PATTERNS

FIELD OF THE INVENTION

The present invention relates to testing of integrated electronic circuits, and in particular, to built-in self test circuits and methods for testing the functionality of integrated electronic circuits.

BACKGROUND OF THE INVENTION

A single very large scale integration (VLSI) semiconductor chip may contain thousands of interconnected logic gates which may include, for example, AND, OR, NAND, NOR, and XOR gates. A critical part of the manufacturing process for any such integrated circuit is verifying the functionality of the logic gates included in the integrated circuit. Verifying the functionality of each logic gate can be difficult because of the limited number of input/output (I/O) pins for the integrated circuit and the complex interconnections between the inputs and outputs of the multitude of logic gates. In many cases, multiple channels within the integrated circuit share I/O pins.

During functional tests of an integrated circuit contained within a semiconductor chip, the integrated circuit's inputs receive known digital data patterns, made up of sequences of 0s and 1s, that are input to the logic gates internal to the chip. In response, the logic gates process the input data patterns, and eventually, the integrated circuit generates output data patterns, again made up of sequences of 0s and 1s, that are dependent upon the input data patterns and the functionality of the logic gates. When the output data patterns do not match predicted output data patterns, it is known that a fault has occurred in at least one of the logic gates.

One option for integrated circuit functional testing involves the application of multiple data patterns to the inputs of the chip in hopes of generating every predicted output data pattern. However, such a test process may require extremely long test times due to the need for generating and inputting a large number of different input data patterns.

Another option involves the application of random data patterns to the integrated circuit's inputs in hopes of identifying defective logic gates. Again, the measured data patterns output from the logic circuit are compared to predicted output data patterns. However, one problem associated with applying random data patterns is that only a portion of the logic circuits will be tested, and therefore, there is a likelihood that an integrated circuit having a defect may go undetected. Applying a larger number of random input data patterns to the integrated circuit's inputs will increase the likelihood that more of the logic gates will be tested. However, the increased number of input data patterns lengthens the overall test time, and thus, increases the overall manufacturing cost for the integrated circuit.

Many integrated circuits include logic gate structures that are difficult to test using a purely random input data pattern. An example of such a logic gate structure is an AND gate. The probability of faults being detected in an AND gate decreases as the number of inputs to the AND gate increases. Initially, in order to check the AND gate for faults, all of the AND gate's inputs must receive an input digit of 1 in order for the signal output from the AND gate to be 1. Next, all but one of the AND gate's inputs should be 1 in order to verify the correct functioning of the AND gate. Therefore, the bits that make up the data pattern input to the integrated circuit must be configured so as to facilitate the various bit changes that must be input to each of the AND gate's inputs.

In order to deal with the limitations of the random number generation test, testing methods that alter the probabilities of generating a 0 or a 1 have been developed. These testing methods weight random input data patterns using a weighted random number generator so as to perform specific tests of a desired logic gate. The weighted random number generator outputs weighted random input patterns to the integrated circuit under test. In the weighted random input patterns, the probability that the input digit is 0 is multiplied by a weighting factor times one half, and the probability that the input digit is 1 is one minus the weighting factor time one half, where the weighting factor is a positive number. Thus, the weighting factor is expressed as a probability of occurrence of a 0 or a 1. The weighting factor is selected dependent upon the number of inputs to the integrated circuit and the number and type of logic gates internal to the chip. In addition, the weighting factor is selected in a manner to facilitate time and cost efficient testing with an acceptable level of confidence that no faults exist in the logic circuit.

SUMMARY OF THE INVENTION

An exemplary circuit for testing an electronic circuit, which weights a plurality of pseudo-random data patterns and inputs signals of the weighted pseudo-random data patterns to an electronic circuit to be tested, includes at least one input logic gate, at least one input multiplexer, at least one control circuit, a first multiplexer, an output logic gate, an output multiplexer, and a weight channel circuit. The at least one input logic gate is configured to receive at least one signal of a pseudo-random data pattern. The at least one input multiplexer is configured to receive a signal that is the same as the signal of the pseudo-random data pattern inputted to the input logic gate and a signal outputted from the input logic gate, and to select and output one of the signals. The at least one control circuit is configured to input a selection signal to the input multiplexer, the selection signal being used for selecting the signal outputted from the input multiplexer. The first multiplexer is configured to receive a signal that is the same as the signal of the pseudo-random data pattern inputted to the input logic gate and a signal outputted from the input multiplexer, and to select and output one of the signals. The output logic gate is configured to receive a signal outputted from the first multiplexer to one input of the output logic gate. The output multiplexer is configured to receive the signal outputted from the output logic gate and a signal inputted from an external input, and to select and input one of the signals to the electronic circuit. The weight channel circuit is configured to input a weight selection signal to the first multiplexer from a selection output of the weight channel circuit, the weight selection signal being used for selecting one of the signals outputted from the first multiplexer, to input another weight selection signal to the output multiplexer from an additional output of the weight channel circuit, the weight selection signal being used for selecting one of the signals outputted from the output multiplexer, the weight channel circuit having another output connected to another input of the output logic gate.

An apparatus for testing an electronic circuit includes a pseudo-random binary number generator, a programmable weighted random pattern generator, and a data compressing device. The pseudo-random binary number generator is configured to generate a plurality of pseudo-random data patterns and output the pseudo-random data patterns. The programmable weighted random pattern generator is provided between the pseudo-random binary number generator and an electronic circuit to be tested, and is configured to receive and weight the pseudo-random data patterns, and to input the weighted pseudo-random data patterns to the electronic circuit. The data compressing device is configured to receive a plurality of output data patterns which the electronic circuit generates in accordance with the weighted pseudo-random data patterns inputted to the electronic circuit and an internal error state of the electronic circuit, and to compress the output data patterns into a unique signature. The programmable weighted random generator has a circuit for testing an electronic circuit that includes at least one input logic gate, at least one input multiplexer, at least one control circuit, a first multiplexer, an output logic gate, an output multiplexer, and a weight channel circuit. The at least one input logic gate is configured to receive at least one signal of a pseudo-random data pattern. The at least one input multiplexer is configured to receive a signal that is the same as the signal of the pseudo-random data pattern inputted to the input logic gate and a signal outputted from the input logic gate, and to select and output one of the signals. The at least one control circuit is configured to input a selection signal to the input multiplexer, the selection signal being used for selecting the signal outputted from the input multiplexer. The first multiplexer is configured to receive a signal that is the same as the signal of the pseudo-random data pattern inputted to the input logic gate and a signal outputted from the input multiplexer, and to select and output one of the signals. The output logic gate is configured to receive a signal outputted from the first multiplexer to one input of the output logic gate. The output multiplexer is configured to receive the signal outputted from the output logic gate and a signal inputted from an external input, and to select and input one of the signals to the electronic circuit. The weight channel circuit is configured to input a weight selection signal to the first multiplexer from a selection output of the weight channel circuit, the weight selection signal being used for selecting one of the signals outputted from the first multiplexer, to input another weight selection signal to the output multiplexer from an additional output of the weight channel circuit, the weight selection signal being used for selecting one of the signals outputted from the output multiplexer, the weight channel circuit having another output connected to another input of the output logic gate.

A method for testing an electronic circuit includes generating a plurality of pseudo-random data patterns, causing a circuit for testing an electronic circuit to weight the pseudo-random data patterns, supplying signals of the weighted pseudo-random data patterns to an electronic circuit to be tested, compressing output data patterns into a unique signature, the output data patterns being patterns the electronic circuit generates in accordance with the signals and a fault state of the electronic circuit, and comparing the unique signature with a signature which the electronic circuit is expected to generate in a proper state, so as to detect a defect in the electronic circuit. The circuit for testing the electronic circuit includes at least one input logic gate configured to receive at least one signal of a pseudo-random data pattern, at least one input multiplexer configured to receive a signal that is the same as the signal of the pseudo-random data pattern inputted to the input logic gate and a signal outputted from the input logic gate, and to select and output one of the signals, at least one control circuit configured to input a selection signal to the input multiplexer, the selection signal being used for selecting the signal outputted from the input multiplexer, a first multiplexer configured to receive a signal that is the same as the signal of the pseudo-random data pattern inputted to the input logic gate and a signal outputted from the input multiplexer, and to select and output one of the signals, an output logic gate configured to receive a signal outputted from the first multiplexer to one input of the output logic gate, an output multiplexer configured to receive the signal outputted from the output logic gate and a signal inputted from an external input, and to select and input one of the signals to the electronic circuit, and a weight channel circuit configured to input a weight selection signal to the first multiplexer from a selection output of the weight channel circuit, the weight selection signal being used for selecting one of the signals outputted from the first multiplexer, to input another weight selection signal to the output multiplexer from an additional output of the weight channel circuit, the weight selection signal being used for selecting one of the signals outputted from the output multiplexer, the weight channel circuit having another output connected to another input of the output logic gate.

Other aspects of the present invention will become readily apparent to those skilled in the art from the following detailed description, which shows and describes exemplary embodiments of the invention, simply by way of illustration of the best mode contemplated for carrying out the invention. The invention is capable of other and different embodiments, and its several details are capable of modifications in various respects, all without departing from the invention. Accordingly, the drawings and description are to be regarded as illustrative in nature, and not as restrictive.

BRIEF DESCRIPTION OF THE DRAWINGS

Various features, aspects, and advantages of the invention will be better understood with regard to the following description, appended claims, and accompanying drawings where:

DETAILED DESCRIPTION OF THE PREFERRED EMBODIMENTS

Figure 1:
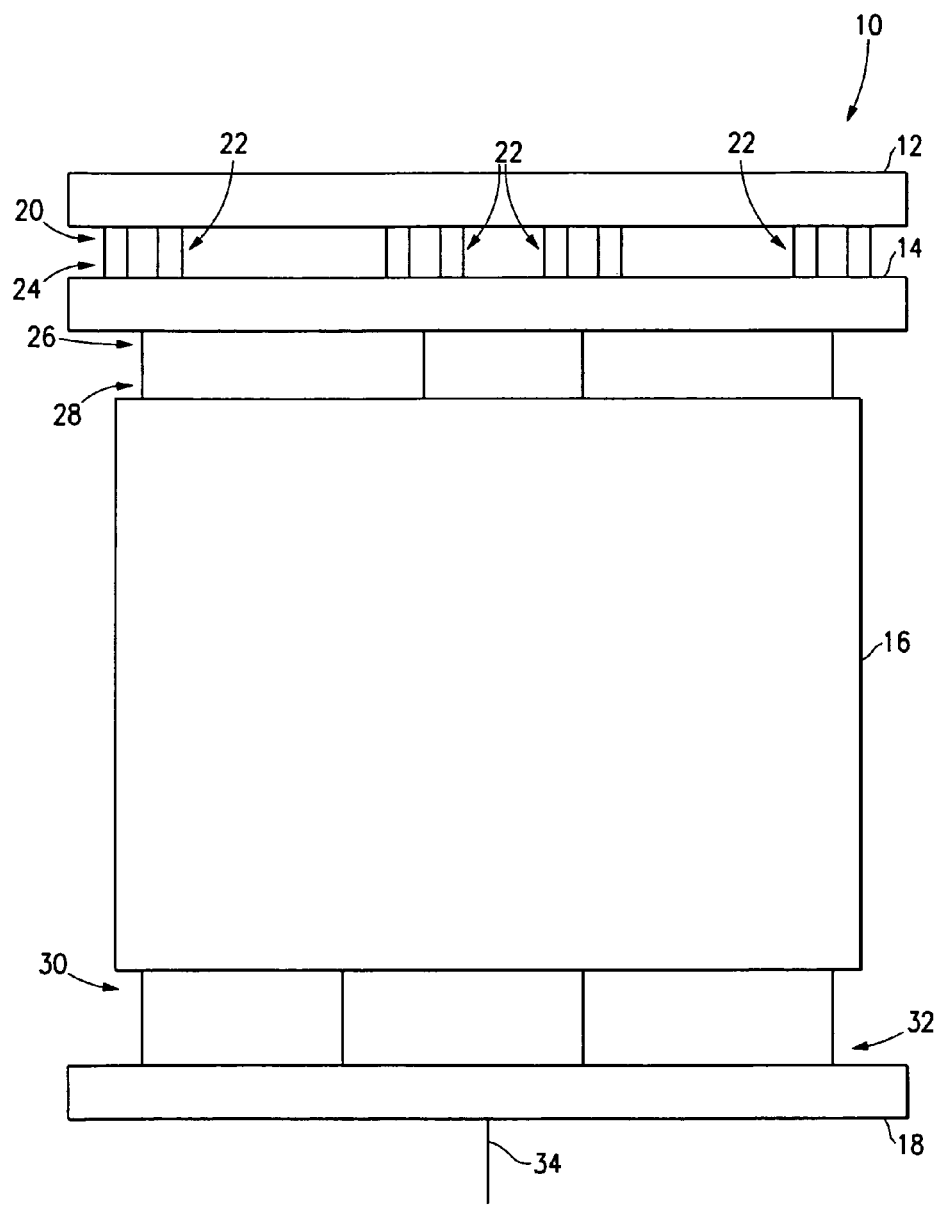
FIG. 1 is a block diagram of a STUMPS structure.

FIG. 1 is a block diagram of a typical logic built-in self test ("LBIST") test configuration 10 which utilizes a psuedo-random pattern generation technique. The LBIST test configuration is also referred to as a scan-path structure called a self test using MSIR and parallel shift register sequence generator ("STUMPS"). The STUMPS structure is a built-in architecture for testing multiple chip systems at high throughput speeds. The LBIST test configuration includes a linear feedback shift register ("LFSR") 12, programmable weighted random pattern generator ("PWR") 14, integrated circuit to be tested 16, and multiple input shift register ("MISR") 18. The LFSR as sixteen outputs 20, comprised of four groups of four outputs 22, that are coupled to sixteen corresponding inputs 24 of the PWR. The PWR has four outputs 26 that are coupled to four corresponding inputs 28 of the integrated circuit. The integrated circuit has four outputs 30 that are coupled to four corresponding inputs 32 of the MISR. The MISR has one output 34.

While, in FIG. 1, the LFSR 12 is depicted as having only sixteen outputs 20, the PWR 14 is depicted as having only sixteen inputs 24 and four outputs 26, the integrated circuit under test 16 is depicted as having four inputs 28 and four outputs 30, and the MISR 18 is depicted as having only four inputs 32 and one output 34, any of the LFSR, PWR integrated circuit under test, and the MISR may have fewer or more inputs or outputs.

In operation, the LFSR 12 operates as a psuedo-random binary number generator that generates pseudo random data patterns that are output from the LFSR and are input to the PWR 14. The PWR receives the pseudo random data patterns from the LFSR and weights the pseudo random data patterns to increase test efficiency. The resulting weighted pseudo-random data patters are output from the PWR and input to the integrated circuit under test 16. The integrated circuit under test generates output data patterns that correspond to the input weighted pseudo random data patterns and the fault state of the logic gates included in the integrated circuit. The resulting output data patterns are output from the integrated circuit under test and input to the MISR 18. The MISR compresses the output data patterns from the integrated circuit under test into a unique signature that represents the responses from the logic circuits included in the integrated circuit under test. The MISR-generated signature is output from the MISR and can be analyzed and compared to the predicted signature. Thus, after analyzing the measured and predicted signatures, it can be determine whether the integrated circuit under test is faulty.

Figure 2:
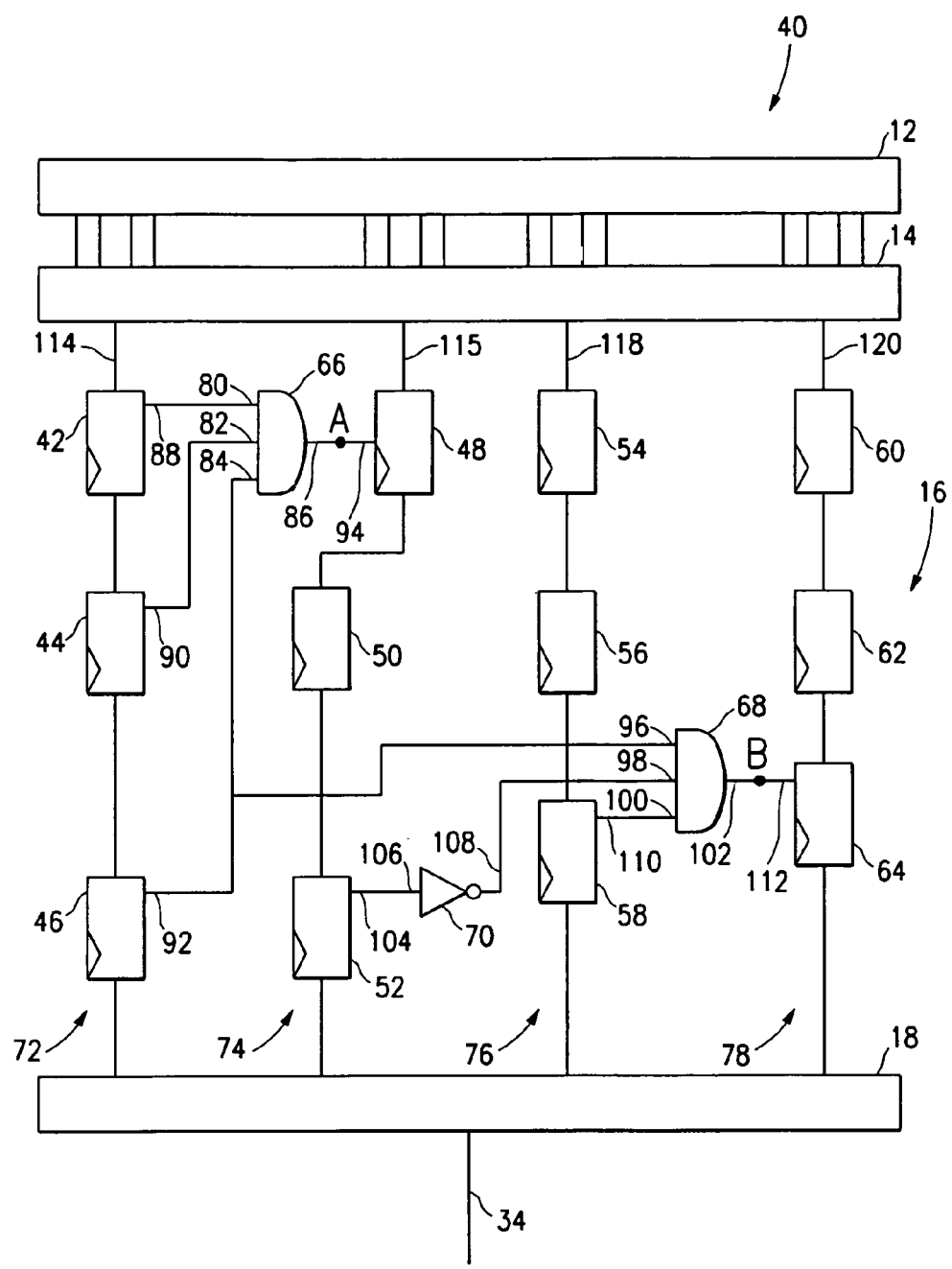
FIG. 2 is a block diagram of a STUMPS structure including a circuit under test having multiple input AND gates.

As discussed previously, efforts to test for defective logic gates are more difficult for specific types of logic gates, for example, AND gates. FIG. 2 depicts a STUMPS test configuration 40 that includes twelve flip-flops 42–64, a first AND gate 66, a second AND gate 68, and an inverter 70. The twelve flip-flops are configured in four columns 72–78, wherein each of the columns includes three series-connected flip-flops. The flip-flops, first and second AND gates, and inverter can be selected from a number of commercially available flip-flops, AND gates, and inverters as desired.

The first AND gate 66 has three inputs 80–84 and one output 86. The output of each of the three series-connected flip-flops 42–46 in the first column 72 is coupled to one of the inputs of the first AND gate. In particular, the first flip-flop's output 88 is coupled to the first AND gate's first input 80, the second flip-flop's output 90 is coupled to the first AND gate's second input 82, and the third flip-flop's output 92 is coupled to the first AND gate's third input 84. The first AND gate's output is coupled to an input 94 of the fourth flip-flop 48 in the second column 74.

The second AND gate 68 has three inputs 96–100 and one output 102. The third flip-flop's output 92 is coupled to the second AND gate's first input 96. The sixth flip-flop's output 104 is coupled to the input 106 of the inverter 70. The output 108 of the inverter is coupled to the second AND gate's second input 98. The ninth flip-flop's output 110 is coupled to the second AND gate's third input 100. The second AND gate's output 102 is coupled to an input 112 of the twelveth flip-flop 64.

As mentioned above, in order to test the function of the first and second AND gates 66 and 68, all of the inputs 80–84 and 96–100 to the AND gates must be set to 1 and the outputs 86 and 102 of the AND gates is monitored as each input changes value from 1 to 0. Therefore, testing for a defect in either of the first or second AND gates can be difficult depending upon the weighted pseudo-random data patters output from the PWR 14 and input to the integrated circuit under test 16. If the integrated circuit under test includes AND gates having many inputs, it is difficult to supply a "1" to all of the inputs of the AND gate using the pseudo-random pattern. Because of this difficulty brought on by the limited number of I/O channels 114–120, fault coverage is limited. FIG. 2 shows a test configuration 40 where defect A can be detected, however, defect B cannot be detected.

Figure 3:
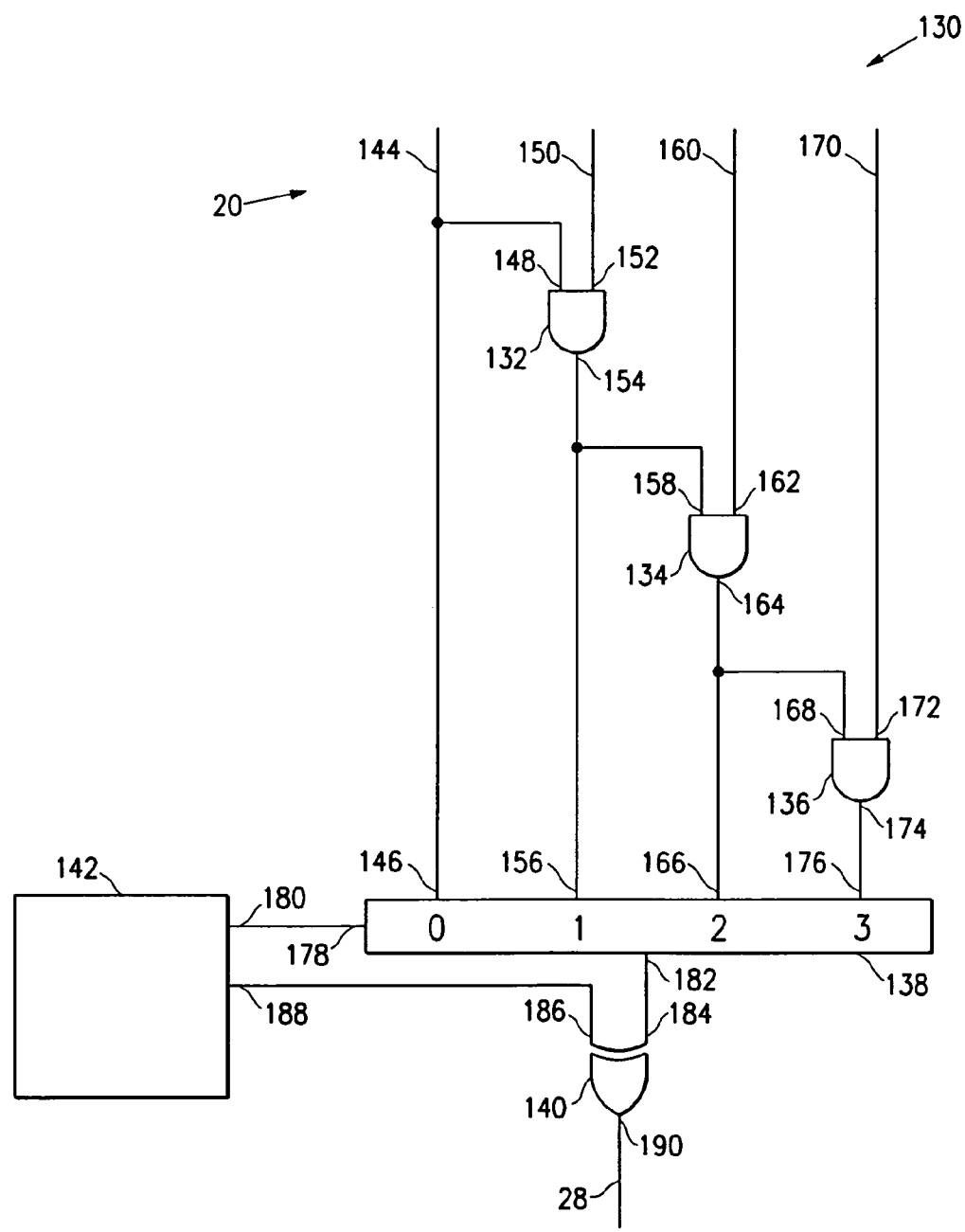
FIG. 3 is a block diagram of a circuit configuration included in a conventional programmable weighted random pattern generator.

FIG. 3 is a block diagram of a circuit configuration 130 that is included in a conventional PWR 14 that includes a first AND gate 132, a second AND gate 134, a third AND gate 136, a 4-to-1 multiplexer 138, an XOR gate 140, and a weight channel circuit 142. A first output 144 of the LFSR 12 is coupled to the 4-to-1 multiplexer's first input 146 and an input 148 of the first AND gate 132. The LFSR's second output 150 is coupled to the other input 152 of the first AND gate 132. The first AND gate's output 154 is coupled to the 4-to-1 multiplexer's second input 156 and an input 158 of the second AND gate 134. The LFSR's third output 160 is coupled to the other input 162 of the second AND gate 134. The second AND gate's output 164 is coupled to the 4-to-1 multiplexer's third input 166 and to an input 168 of the third AND gate 136. The LFSR's fourth output 170 is coupled to the other input 172 of the third AND gate 176. The third AND gate's output 174 is coupled to the 4-to-1 multiplexer's fourth input 176.

The 4-to-1 multiplexer's two selection lines (only one shown) 178 are coupled to the selection outputs (only one shown) 180 of the weight channel circuit 142. The 4-to-1 multiplexer's output 182 is coupled to one input 184 of the XOR gate 140. The XOR gate's other input 186 is coupled to another output 188 of the weight channel circuit. Referring additionally to FIG. 1, the XOR gate's output 190 is coupled to an input of the circuit under test 16.

As mentioned above, the circuit configuration 130 depicted in FIG. 3 represents only a portion of the PWR 14. Since the circuit configuration depicted in FIG. 3 couples to four output lines 22 from the LFSR 12 and one input channel 28 of the circuit under test 16, four of the circuit configurations depicted in FIG. 3 would be included in the PWR. Therefore, the number of circuit configurations can vary and is dependent upon the number of outputs 20 from the LFSR and the number of input channels 28 for the circuit under test.

The first, second, and third AND gates 132–136, the 4-to-1 multiplexer 138, and the XOR gate 140 may be selected from a number of commercially available electronic parts as desired.

In operation, the circuit configuration 130 depicted in FIG. 3 receives pseudo-random four-bit data patterns from the LFSR 12. The probability of each of the four bits being a 0 or a 1 is $\frac{1}{2}$. Therefore, the probability that the first bit output from the LFSR and received at the 4-to-1 multiplexer's first input 146 is 1 is $\frac{1}{2}$. Since the probability of the first bit output from the LFSR and input to one input 148 of the first AND gate 132 being 1 is $\frac{1}{2}$, and the probability of the second bit output from the LFSR and input to the other input 152 of the first AND gate 132 being 1 is $\frac{1}{2}$, the probability of the signal output from the first AND gate 132 and input to the 4-to-1 multiplexer's second input 156 being 1 is $\frac{1}{4}$. Since the probability of the signal output from the first AND gate and input 158 to one input of the second AND gate 134 being 1 is $\frac{1}{4}$, and the probability of the third bit output from the LFSR and input to the other input 162 of the second AND gate 134 being 1 is ½, the probability of the signal output from the second AND gate and input to the 4-to-1 multiplexer's third input 166 being 1 is ⅛. Also, since the probability of the signal output from the second AND gate 134 and input to one input 168 of the third AND gate 136 being 1 is ⅛, and the probability of the fourth bit output from the LFSR and input to the other input 172 of the third AND gate 136 being 1 is ½, the probability of the signal output from the third AND gate 136 and input to the 4-to-1 multiplexer's fourth input 176 being 1 is ¹⁄₁₆.

The signal output from the 4-to-1 multiplexer 138 is controlled by the two weight selection signals output from the weight channel circuit 142 and input to the selection lines 178 of the 4-to-1 multiplexer. When the weight selection signals on the two selection lines is (0,0), (0,1), (1,0), or (1,1), the signal output from the 4-to-1 multiplexer is either the signal received by the 4-to-1 multiplexer's first input, second input, third input, or fourth input, 146, 156, 166, and 176, respectively. Thus, when the weight selection signals are (0,0), (0,1), (1,0), or (1,1), the probability of the signal at the 4-to-1 multiplexer's output 182 being 1 is ½, ¼, ⅛, or ¹⁄₁₆, respectively.

The weight channel circuit 142 depicted in FIG. 3 also outputs a single bit control signal that is received by one input 186 of the XOR 140. The other input 184 of the XOR receives the signal output from the 4-to-1 multiplexer 138. The probability of the signal output from the XOR gate is dependent upon the signal output from the 4-to-1 multiplexer in addition to the single bit control signal. When the single bit control signal is 0, and selection line signals are (0,0), (0,1), (1,0), or (1,1), the probability of the signal at the XOR. gate's output 190 being 1 is ½, ¼, ⅛, or ¹⁄₁₆, respectively. In addition, when the single bit control signal is 1, and selection line signals are (0,0), (0,1), (1,0), or (1,1), the probability of the signal at the XOR gate's output being 1 is ½, ¾, ⅞, or ¹⁵⁄₁₆, respectively.

Figure 4:
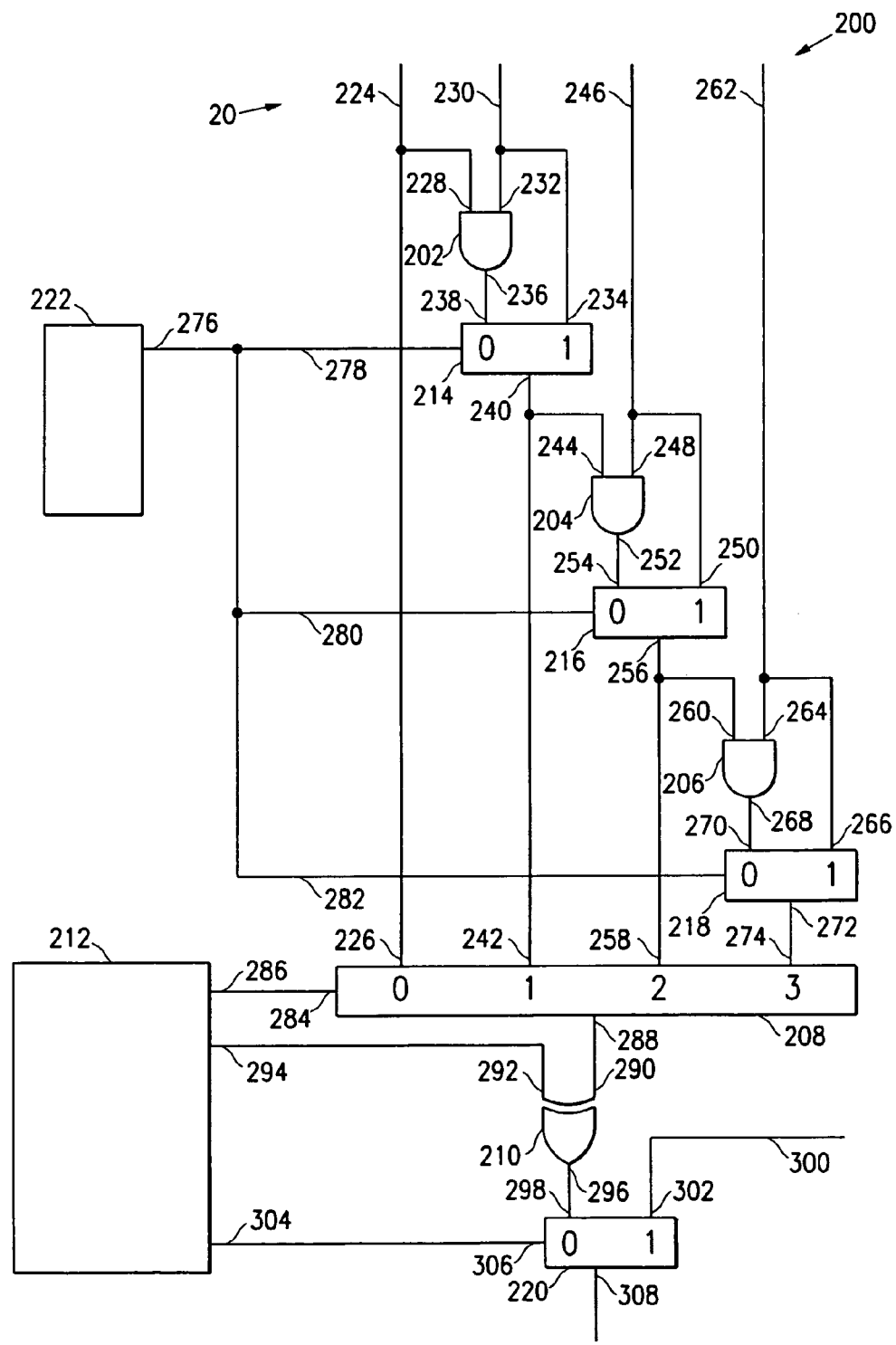
FIG. 4 is a block diagram of an embodiment of a circuit configuration included in a programmable weighted random pattern generator according to the present invention.

FIG. 4 is a block diagram of a circuit configuration 200 included in a PWR 14 that is an embodiment of the present invention. Similar to the circuit configuration of FIG. 3, the circuit configuration of FIG. 4 includes a first AND gate 202, a second AND gate 204, a third AND gate 206, a 4-to-1 multiplexer 208, an XOR gate 210, and a weight channel circuit 212. In addition, the circuit configuration depicted in FIG. 4 includes a first 2-to-1 multiplexer 214, a second 2-to-1 multiplexer 216, a third 2-to-1 multiplexer 218, a fourth 2-to-1 multiplexer 220, and a control circuit 222.

The 4-to-1 multiplexer 208 is also referred to as the first multiplexer, and the first, second, and third 2-to-1 multiplexers 214, 216, and 218, respectively, are also cumulatively referred to as at least one other multiplexer. The fourth 2-to-1 multiplexer 220 is also referred to as the output multiplexer. The XOR gate 210 is also referred to as the output logic gate, and the first, second, and third AND gates 202, 204, and 206, respectively, are also collectively referred to as the another logic gate.

The first, second, third, and fourth 2-to-1 multiplexers 214–220, and the control circuit 222 may be selected from any of various types of electronic components as desired. In alternative embodiments, the components included in the circuit configuration 200 of FIG. 4 are housed within a single electronic chip (not shown).

A first output 224 of the LFSR 12 is coupled to the 4-to-1 multiplexer's first input 226 and an input 228 of the first AND gate 202. The LFSR's second output 230 is coupled to the other input 232 of the first. AND gate 202 and the first 2-to-1 multiplexer's second input 234. The first AND gate's output 236 is coupled to the first 2-to-1 multiplexer's first input 238. The first 2-to-1 multiplexer's output 240 is coupled to 4-to-1 multiplexer's second input 242 and one input 244 of the second AND gate 204. The LFSR's third output 246 is coupled to the other input 248 of the second AND gate 204 and the second 2-to-1 multiplexer's second input 250. The second AND gate's output 252 is coupled to the second 2-to-1 multiplexer's first input 254. The output 256 of the second 2-to-1 multiplexer 216 is coupled to the 4-to-1 multiplexer's third input 258 and one input 260 of the third AND gate 206. The LFSR's fourth output 262 is coupled to the other input 264 of the third AND gate 206 and the third 2-to-1 multiplexer's second input 266. The third AND gate's output 268 is coupled to the third 2-to-1 multiplexer's first input 270. The third 2-to-1 multiplexer's output 272 is coupled to the 4-to-1 multiplexer's fourth input 274. An output 276 of the control circuit 222 is coupled to the first 2-to-1 multiplexer's selection line 278, the second 2-to-1 multiplexer's selection line 280, and the third 2-to-1 multiplexer's selection line 282.

While the embodiment 200 depicted in FIG. 4 illustrates only one control circuit 222, there may be additional embodiments (not shown) that include more than one control circuit. In these additional embodiments, the each control circuit may be coupled to the selection line of one or more 2-to-1 multiplexers. Thus, there may be embodiments in which the signal on the selection lines is different for the 2-to-1 multiplexers.

The 4-to-1 multiplexer's two selection lines (only one shown) 284 are coupled to selection outputs (only one shown) 286 of the weight channel circuit 212. The 4-to-1 multiplexer's output 288 is coupled to one input 290 of the XOR gate 210. The XOR gate's other input 296 is coupled to another output 294 of the weight channel circuit. The XOR gate's output 296 is coupled to the fourth 2-to-1 multiplexer's first input 298. An external input 300 is coupled to the fourth 2-to-1 multiplexer's second input 302. An additional output 304 of the weight channel circuit is coupled to the fourth 2-to-1 multiplexer's selection line 306. Referring additionally to FIG. 1, the fourth 2-to-1 multiplexer's output 308 is coupled to an input 28 of the circuit under test 16.

In operation, the circuit configuration 200 depicted in FIG. 4 receives pseudo-random four-bit data patterns from the LFSR 12. The probability of the signals received at the 4-to-1 multiplexer's inputs 226, 242, 258, and 274 being 1 is dependent upon the selection signal on the selection lines 278, 280, and 282 of the first, second, and third 2-to-1 multiplexers 214, 216, and 218, respectively. In the case where the selection signals on the selection lines of the first, second, and third 2-to-1 multiplexers are 0, the outputs 236, 252, and 268 of the first, second, and third AND gates 202, 204, and 206, respectively, are coupled to the second, third, and fourth inputs 242, 258, and 274, respectively, of the 4-to-1 multiplexer 208. Thus, the probability of the signal output from the 4-to-1 multiplexer and also the XOR gate 296 are the same as those of the circuit configuration 130 depicted in FIG. 3.

The circuit configuration 200 of FIG. 4 has the added feature that the signal output from the fourth 2-to-1 multiplexer 220 is dependent upon the output selection signal output from the weight channel circuit 212 and input to the fourth 2-to-1 multiplexer's selection line 306. When the output selection signal input to the fourth 2-to-1 multiplexer's selection line is 0, the signal output from the XOR gate 210 is coupled through the fourth 2-to-1 multiplexer and output from the fourth 2-to-1 multiplexer. When the output selection signal input to the fourth 2-to-1 multiplexer's selection line is 1, the signal on the external input 300 is coupled through the fourth 2-to-1 multiplexer and output from the fourth 2-to-1 multiplexer.

In the case where the signals on the selection lines 278, 280, and 282 of the first, second, and third 2-to-1 multiplexers 214, 216, and 218, respectively, are 1, the second, third, and fourth bits output from the LFSR 12 respectively are coupled to the second, third, and fourth inputs 242, 258, and 274, respectively, of the 4-to-1 multiplexer 208 through the first, second, and third 2-to-1 multiplexers 214, 216, and 281, respectively. As discussed above, the probability of each of the four bits output from the LFSR being a 0 or a 1 is ½. Thus, the probability that the first, second, third, and fourth bits output from the LFSR and received at the 4-to-1 multiplexer's first, second, third, and fourth input 226, 242, 258, and 274, respectively, is 1 is ½. Accordingly, regardless of the state of the signal input to the 4-to-1 multiplexer's selection lines (one shown) 284, the probability of signal output from the 4-to-1 multiplexer being 1 is ½. Also, the probability of the signal output from the XOR gate 210 being 1 is ½ regardless of the signal output from the weight channel circuit's another output 294.

As discussed above, the signal output from the fourth 2-to-1 multiplexer's output 308 in the circuit configuration 200 of FIG. 4 is dependent upon the signal output from the weight channel circuit's additional output 304 and input to the fourth 2-to-1 multiplexer's selection line 306. In the case where the signal input to the fourth 2-to-1 multiplexer's selection line is 0, the signal output from the XOR gate 210 is coupled through the fourth 2-to-1 multiplexer 220 and output from the fourth 2-to-1 multiplexer's output. Thus, when the signal input to the fourth 2-to-1 multiplexer's selection line is 0, the probability of the signal output from the XOR gate being 1 is ½. In contrast, when the signal input to the fourth 2-to-1 multiplexer's selection line is 1, the signal output from the XOR gate is the signal present on external input 300 and the probability of the signal output from the fourth 2-to-1 multiplexer being 1 is dependent upon the probability of the signal present on the external input being 1.

Thus, the probability of the signal output from the fourth 2-to-1 multiplexer 220 being 1 is dependent upon the signals output from the weight channel circuit's additional output 304 as well as the signals output from the weight channel circuit's selection and another outputs 286 and 294, respectively, and the signal input to the selection lines 278, 280, and 282 of the first, second, and third 2-to-1 multiplexer 214, 216, and 218, respectively. Therefore, the circuit configuration 200 depicted in FIG. 4 advantageously offers an output signal that has a selectable probability of being 1. The present invention offers greater flexibility in generating test signals to be transferred across the I/O channels to the electronic circuit under test 16, thus, increasing the fault coverage of the electronic circuit under test.

In additional embodiments, the circuit configuration 200 depicted in FIG. 4 can be extended such that the 4-to-1 multiplexer 208 is an $2^n$-to-1 multiplexer, where n is an integer greater than one, and the circuit configuration includes $2^n$-1 AND gates and $2^n$-1 2-to-1 multiplexers, and similar coupling between the control circuit 212, $2^n$-1 AND gates, $2^n$-1 2-to-1 multiplexers and the LFSR 12. In these additional embodiments, the circuit configuration couples to $2^n$ outputs of the LFSR and one input of the circuit under test 16.

Also, the circuit configuration 200 of FIG. 4 is advantageous in that a computer (not shown) can control the control circuit 212, the weight channel circuit 212, and the external input 300. Because the circuit configuration is computer-controllable, the patterns generated by the circuit configuration and supplied to the electronic circuit under test 16 can be modified to satisfy test requirements.

Moreover, to those skilled in the various arts, the invention itself herein will suggest solutions to other tasks and adaptations for other applications. The present embodiments must therefore be considered in all respects as illustrative and not restrictive. The scope of the invention is not limited to those embodiments, but must be determined instead by the appended claims, along with the full scope of equivalents to which those claims are legally entitled.

What is claimed is:

1. A circuit for testing an electronic circuit, which weights a plurality of pseudo-random data patterns and inputs signals of the weighted pseudo-random data patterns to an electronic circuit to be tested, comprising:
   at least one input logic gate configured to receive at least one signal of a pseudo-random data pattern;
   at least one input multiplexer configured to receive a signal that is the same as the signal of the pseudo-random data pattern inputted to the input logic gate and a signal outputted from the input logic gate, and to select and output one of the signals;
   at least one control circuit configured to input a selection signal to the input multiplexer, the selection signal being used for selecting the signal outputted from the input multiplexer;
   a first multiplexer configured to receive a signal that is the same as the signal of the pseudo-random data pattern inputted to the input logic gate and a signal outputted from the input multiplexer, and to select and output one of the signals;
   an output logic gate configured to receive a signal outputted from the first multiplexer to one input of the output logic gate;
   an output multiplexer configured to receive the signal outputted from the output logic gate and a signal inputted from an external input, and to select and input one of the signals to the electronic circuit; and a weight channel circuit configured to input a weight selection signal to the first multiplexer from a selection output of the weight channel circuit, the weight selection signal being used for selecting one of the signals outputted from the first multiplexer, to input another weight selection signal to the output multiplexer from an additional output of the weight channel circuit, the weight selection signal being used for selecting one of the signals outputted from the output multiplexer, the weight channel circuit having another output connected to another input of the output logic gate.

2. The circuit according to claim 1, wherein the first multiplexer is a $2^n$-to-1 multiplexer, where n is an integer greater than 1.

3. The circuit according to claim 1, wherein the input multiplexer is a 2-to-1 multiplexer.

4. The circuit according to claim 1, wherein the output logic gate is an XOR gate.

5. The circuit according to claim 1, wherein the input logic gate is an AND gate.

6. An apparatus for testing an electronic circuit, comprising:
   a pseudo-random binary number generator configured to generate a plurality of pseudo-random data patterns and output the pseudo-random data patterns;

a programmable weighted random pattern generator provided between the pseudo-random binary number generator and an electronic circuit to be tested, the programmable weighted random pattern generator being configured to receive the pseudo-random data patterns and weight the pseudo-random data patterns, the programmable weighted random pattern generator being configured to input the weighted pseudo-random data patterns to the electronic circuit;

a data compressing device configured to receive a plurality of output data patterns which the electronic circuit generates in accordance with the weighted pseudo-random data patterns inputted to the electronic circuit and an internal error state of the electronic circuit, the data compressing device being configured to compress the output data patterns into a unique signature;

wherein the programmable weighted random generator has a circuit for testing an electronic circuit that comprises;

at least one input logic gate configured to receive at least one signal of a pseudo-random data pattern;

at least one input multiplexer configured to receive a signal that is the same as the signal of the pseudo-random data pattern inputted to the input logic gate and a signal outputted from the input logic gate, and to select and output one of the signals;

at least one control circuit configured to input a selection signal to the input multiplexer, the selection signal being used for selecting the signal outputted from the input multiplexer;

a first multiplexer configured to receive a signal that is the same as the signal of the pseudo-random data pattern inputted to the input logic gate and a signal outputted from the input multiplexer, and to select and output one of the signals;

an output logic gate configured to receive a signal outputted from the first multiplexer to one input of the output logic gate;

an output multiplexer configured to receive the signal outputted from the output logic gate and a signal inputted from an external input, and to select and input one of the signals to the electronic circuit; and a weight channel circuit configured to input a weight selection signal to the first multiplexer from a selection output of the weight channel circuit, the weight selection signal being used for selecting one of the signals outputted from the first multiplexer, to input another weight selection signal to the output multiplexer from an additional output of the weight channel circuit, the weight selection signal being used for selecting one of the signals outputted from the output multiplexer, the weight channel circuit having another output connected to another input of the output logic gate.

7. The apparatus according to claim 6, wherein the first multiplexer is a $2^n$-to-1 multiplexer, where n is an integer greater than 1.

8. The apparatus according to claim 6, wherein the input multiplexer is a 2-to-1 multiplexer.

9. The apparatus according to claim 6, wherein the output logic gate is an XOR gate.

10. The apparatus according to claim 6, wherein the input logic gate is an AND gate.

11. A method for testing an electronic circuit, comprising:

generating a plurality of pseudo-random data patterns;

causing a circuit for testing an electronic circuit to weight the pseudo-random data patterns;

supplying signals of the weighted pseudo-random data patterns to an electronic circuit to be tested;

compressing output data patterns into a unique signature, the output data patterns being patterns the electronic circuit generates in accordance with the signals and a fault state of the electronic circuit; and comparing the unique signature with a signature which the electronic circuit is expected to generate in a proper state, so as to detect a defect in the electronic circuit;

wherein the circuit for testing an electronic circuit comprises:

at least one input logic gate configured to receive at least one signal of a pseudo-random data pattern;

at least one input multiplexer configured to receive a signal that is the same as the signal of the pseudo-random data pattern inputted to the input logic gate and a signal outputted from the input logic gate, and to select and output one of the signals;

at least one control circuit configured to input a selection signal to the input multiplexer, the selection signal being used for selecting the signal outputted from the input multiplexer;

a first multiplexer configured to receive a signal that is the same as the signal of the pseudo-random data pattern inputted to the input logic gate and a signal outputted from the input multiplexer, and to select and output one of the signals;

an output logic gate configured to receive a signal outputted from the first multiplexer to one input of the output logic gate;

an output multiplexer configured to receive the signal outputted from the output logic gate and a signal inputted from an external input, and to select and input one of the signals to the electronic circuit; and a weight channel circuit configured to input a weight selection signal to the first multiplexer from a selection output of the weight channel circuit, the weight selection signal being used for selecting one of the signals outputted from the first multiplexer, to input another weight selection signal to the output multiplexer from an additional output of the weight channel circuit, the weight selection signal being used for selecting one of the signals outputted from the output multiplexer, the weight channel circuit having another output connected to another input of the output logic gate.

* * * * *